(12) United States Patent
Sung

(10) Patent No.: US 6,211,553 B1
(45) Date of Patent: *Apr. 3, 2001

(54) THIN-FILM TRANSISTOR, A METHOD FOR MANUFACTURING SAME, AND A LIQUID CRYSTAL DISPLAY DEVICE USING THE TRANSISTOR

(75) Inventor: Chae Gee Sung, Miyagi-ken (JP)

(73) Assignee: L. G. Philips LCD Co., Ltd., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/976,963

(22) Filed: Nov. 24, 1997

(30) Foreign Application Priority Data

Nov. 25, 1996 (JP) .................................................... 8-313963

(51) Int. Cl.⁷ .................................................... H01L 29/00
(52) U.S. Cl. .............................. 257/347; 257/66; 257/72; 257/348; 257/349; 257/350; 257/351; 257/352; 257/353; 257/354; 257/355; 257/336; 257/344
(58) Field of Search .............................. 257/66, 72, 349, 257/347–355, 336, 344

(56) References Cited

U.S. PATENT DOCUMENTS

| | | | |
|---|---|---|---|
| 5,557,231 | * 9/1996 | Yamaguchi et al. | 327/336 |
| 5,705,829 | * 1/1998 | Miyanaga et al. | 257/69 |
| 5,757,045 | * 5/1998 | Tsai et al. | 257/344 |
| 5,763,904 | * 6/1998 | Nakajima et al. | 257/66 |
| 5,798,744 | * 8/1998 | Tanaka et al. | 345/92 |
| 5,977,591 | * 11/1999 | Fratin et al. | 257/344 |

FOREIGN PATENT DOCUMENTS 08037310    2/1996   (JP) .

* cited by examiner

*Primary Examiner*—Fetsum Abraham
(74) *Attorney, Agent, or Firm*—Brinks Hofer Gilson & Lione

(57) ABSTRACT

A thin-film transistor comprises a semiconductor unit 60 constituted of a channel formation portion 61 and a source region 63 and a drain region 62 sandwiching the channel formation portion 61 therebetween, a transparent pixel electrode 54 made of indium tin oxide, a drain electrode 57 and a source electrode 58 each made of Cr, Mo, Ta or W, and a gate electrode 68 formed on the channel formation portion via a gate insulating layer 58, wherein the drain region and the source region are, respectively, connected with the electrodes through silicide layers 64, 65 formed by diffusion of the any above-mentioned element. A method for making the transistor and a liquid crystal display device comprising the transistor are also disclosed.

5 Claims, 7 Drawing Sheets

THIN-FILM TRANSISTOR, A METHOD FOR MANUFACTURING SAME, AND A LIQUID CRYSTAL DISPLAY DEVICE USING THE TRANSISTOR

BACKGROUND OF THE INVENTION

This invention relates to a thin-film transistor, a method for manufacturing the same, and a liquid crystal display device using the transistor.

Liquid crystal display devices have wide utility as display devices capable of realizing lightweight, miniaturization, and thinning. Among them, twisted nematic mode (TN mode) active matrix liquid crystal devices are widely known as a display device whose drive voltage is low with an attendant low power consumption and which is high in contrast and is able to provide high-quality images.

FIG. 7 shows a typical prior art thin-film transistor having a top gate structure provided in this type of liquid crystal device. A thin-film transistor A of the prior art is arranged such that it includes an island-shaped semiconductor unit 2 on a transparent substrate 1, an insulating layer 3 formed on the substrate 1 to cover the semiconductor unit 2 therewith, a source electrode 4 and a drain electrode 5 connected via the insulating layer 3 to the semiconductor unit 2, an insulating layer 6 to cover them as shown, and a pixel electrode 7 formed on the insulating layer 6.

The semiconductor unit 2 is constituted of a channel formation portion 8 at the center thereof, and a source region 9 and a drain region 10 formed to sandwich the channel formation portion 8 therebetween from opposite sides thereof. The source electrode 4 is connected to the source region 9 and the drain electrode 5 is connected to the drain region 10, and the pixel electrode 5 is connected to the drain electrode 5. A gate electrode 12 is formed within the insulating layer 3 above the channel formation portion 8 via a gate insulating layer 11.

In the structure depicted in FIG. 7, the semiconductor unit 2 is generally constituted of an amorphous silicon or a polysilicon, the source electrode 4 and the drain electrode 5 are constituted of conductive metal materials, and the pixel electrode 7 is constituted of a transparent conductive film such as ITO (indium tin oxide). The thin film transistor A of this example has a structure such that a load in the channel formation portion 8 is controlled by the action of electric field generated by the gate electrode 12 to thereby obtain the operation as a switch.

In the structure depicted in FIG. 7 wherein the pixel electrode 7 is indirectly connected to the drain region 10 via the drain electrode 5, an insulating layer 6 is freshly formed after the formation of the drain electrode 5. This essentially requires the formation of a contact hole in the insulating layer 6, after which the pixel electrode 7 has to be formed, thus presenting the problem that the manufacturing process becomes complicated. Especially, there arises the problem that for the formation of the contact hole in the insulating layer 6, an additional mask is required in a photolithographic step.

It may occur to one that using the structure shown in FIG. 8, a connection terminal 7A of the pixel electrode 7 is connected directly to the drain region 10 to make a contact. In this connection, however, the structure of FIG. 8 has the problem that any good contact is not possible owing to the reason set out below.

The semiconductor unit 2 is constituted of an amorphous silicon film or a polysilicon film, and the film is doped with ions to form n$^+$ layers thereby forming the source region 9 and the drain region 10. These source and drain regions 9, 10, respectively, have a relatively great specific resistance of about $10^{-2}$ to $10^{-3}$ Ω×cm. If the ITO pixel electrode 7 is formed directly on the regions 9, 10, there arises the problem that the electric resistance at the connections becomes great.

To avoid this, it is usual in prior art to diffuse a silicide of an element such as Cr, Ta, W or the like into the upper portions of the source and drain regions 9, 10 to form a thin silicide layer whose specific resistance is low (e.g. a specific resistance of about $10^{-4}$ Ω×cm), ensuring the connections through the silicide layer. However, where the contact holes are formed in the insulating layer 3 for the formation of the connection terminal 7A, a problem is involved in that when over-etched, the silicide layers beneath the contact holes are etched and thus disappear. Thus, it becomes difficult to make good contacts ensuring low resistance connections. Moreover, Al is known as a material for interconnection which is low in specific resistance and which is unlikely to cause the delay of signals. Al is also known as an element which is difficult to make good contact with the ITO pixel electrode 7, thus presenting the problem that this material cannot be adopted in the structure shown in FIG. 8.

SUMMARY OF THE INVENTION

It is accordingly an object of the invention to provide a thin-film transistor which can overcome the problems of the prior art counterparts and wherein the interconnection resistance between a drain region and a drain electrode and the interconnection resistance between a source region and a source electrode are, respectively, lessened to ensure good contacts thereat, along with the good contact between the drain electrode and a pixel electrode and the good contact between the source interconnection and the source electrode.

It is another object of the invention to provide a method for making such a thin-film transistor of the type mentioned above wherein the transistor can be made according to a process having a reduced number of steps than in prior processes, with a reduced number of masks.

It is another object of the invention to provide a method for making a thin-film transistor wherein the thin-film transistor which has a reduced leakage current at the Off time and which is improved in reliability can be readily made without changing the manufacturing conditions from those conditions of prior art.

It is another object of the invention to provide a liquid crystal display device which comprises a thin-film transistor of the type mentioned above.

According to one embodiment of the invention, there is provided a thin-film transistor which comprises a silicon semiconductor unit formed on a substrate and having a channel formation portion sandwiched between a source region and a drain region at opposite sides of the channel formation portion, a gate electrode formed on the channel formation portion via a gate insulating layer, a pixel electrode formed on the substrate, kept away from the semiconductor unit and made of ITO, a drain electrode electrically connecting the pixel electrode with the drain region, a source interconnection formed in spaced relation with the source region, and a source electrode electrically connecting the source interconnection and the source region, wherein the source electrode and the drain electrode are, respectively, formed of a metal which is more unlikely to be oxidized than tin and is capable of alloying with silicon, and a connection between the drain electrode and the drain region and a connection between the source electrode and the source region is formed of a silicide of the metal and silicon.

In the practice of the invention, if the drain electrode or the source electrode is made of any of Cr, Mo, Ta and W, a low resistance connection with a transparent pixel electrode made of ITO can be realized, ensuring good contact.

Further, if a source interconnection is made of Al, Al makes a good contact with any element selected from Cr, Mo, Ta and W which constitutes the source electrode, so that good connection with the source electrode is ensured as having a low resistance. In addition, any delay of signals inputted to the source interconnection is not caused.

According to another embodiment of the invention, there is also provided a method for making a thin-film semiconductor, which comprises the steps of forming, on a substrate, a semiconductor layer and a transparent pixel electrode made of ITO, which are kept away from each other, forming a gate insulating layer and a gate electrode on a central portion of the semiconductor layer in this order, subjecting the semiconductor layer to ion doping at opposite sides thereof to form a source region and a drain region, forming an electrode layer made of an element selected from Cr, Mo, Ta and W on the substrate to cover the semiconductor layer and the pixel electrode, subjecting the substrate, after the formation of the electrode layer, to thermal treatment to permit the constituent element of the electrode layer to be diffused into the source region and the drain region so that a silicide layer is formed in the surface side of the source region and in the surface side of the drain region, respectively, removing part of the electrode layer to form a drain electrode connecting the pixel electrode and the drain region and also to form a source electrode connecting to the source region, and forming a source interconnection connecting to the source electrode.

By carrying out the above method, there can be obtained a low resistance connection structure connecting the drain region and the drain electrode via the silicide layer and also a low resistance connection structure between the source region and the source electrode via the silicide layer. The drain electrode made of any of Cr, Mo, Ta or W is able to connect with the ITO pixel electrode at a low resistance in good contact.

According to a further embodiment of the invention, there is provided a liquid crystal display device which comprises a pair of substrates including a substrate having a thin-film transistor defined above and another substrate provided in face-to-face relation with the first-mentioned substrate and having a common electrode, and a liquid crystal sealed between the paired substrates.

Thus, there can be obtained a liquid crystal display device which comprises the thin-film transistor showing such good features as set out above.

BRIEF DESCRIPTION OF THE DRAWINGS

FIGS. 4A to 4C are, respectively, a sectional view illustrating a method of the invention wherein FIG. 4A is a sectional view showing the state of forming a black mask on a substrate, FIG. 4B is a sectional view showing the state of building up an insulating layer, a semiconductor layer and an insulating layer on the substrate, and FIG. 4C is a sectional view showing the state of patterning the insulating layer and the semiconductor layer;

FIGS. 5A to 5C are, respectively, a sectional view illustrating the method of the invention wherein FIG. 5A is a sectional view showing the state of forming a pixel electrode, FIG. 5B is a sectional view showing the state of further forming an insulating layer and a conductive layer, and FIG. 5C is a sectional view showing the state of forming a gate insulating layer and a gate electrode, after which ion doping is effected;

FIGS. 6A to 6C are, respectively, a sectional view illustrating the method of the invention wherein FIG. 6A is a sectional view showing the state of forming a drain region, a source region and a channel formation portion as a result of the ion doping, FIG. 6B is a sectional view showing the state of forming a drain electrode and a source electrode, and FIG. 6C is a sectional view showing the state of forming an insulating layer and a contact hole;

DESCRIPTION OF THE PREFERRED EMBODIMENTS

Embodiments of the invention are illustrated with reference to the accompanying drawings.

Figure 1:
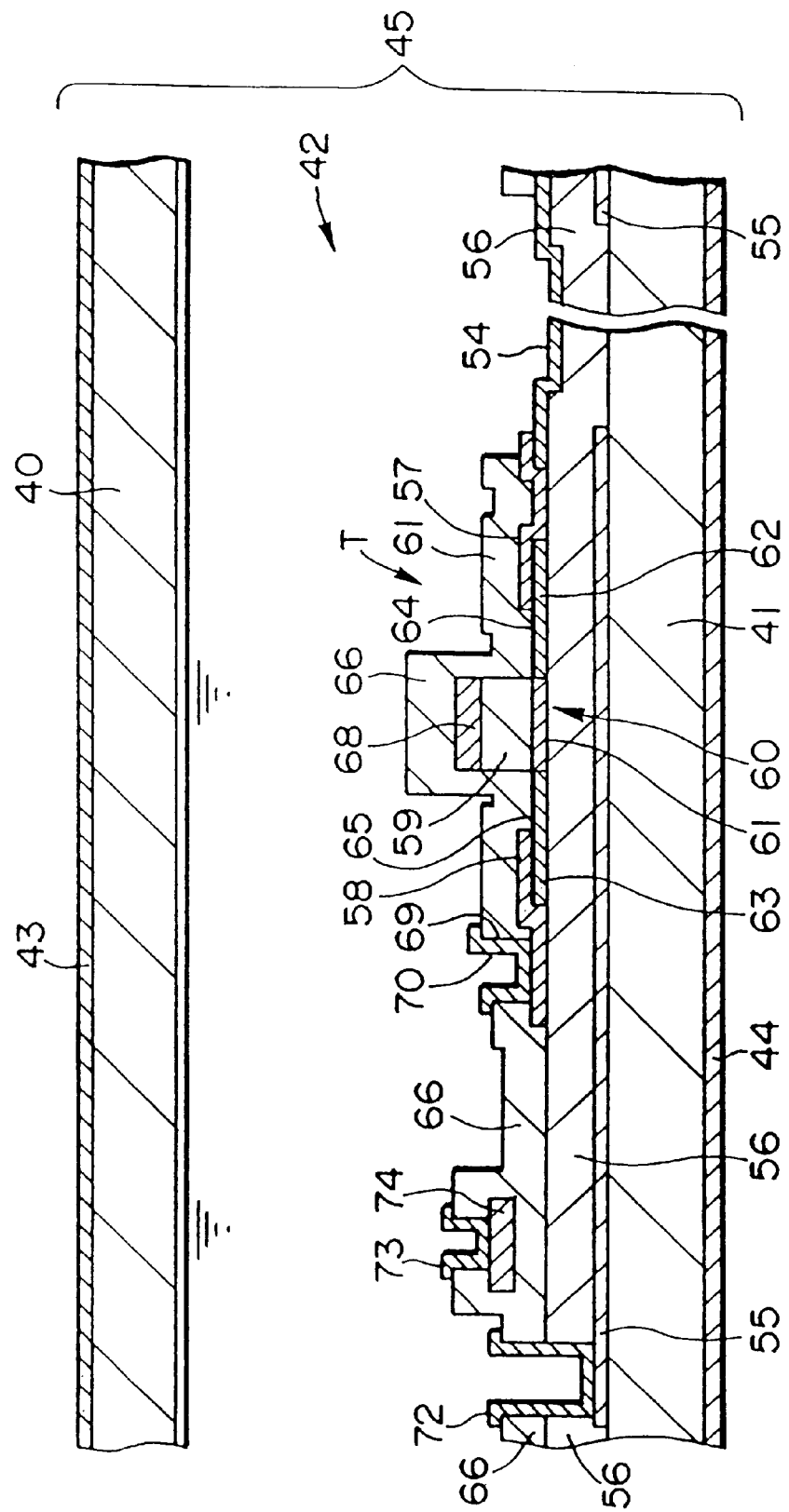
FIG. 1 is a sectional view showing a liquid crystal display device according to the first embodiment of the invention.
Figure 2:
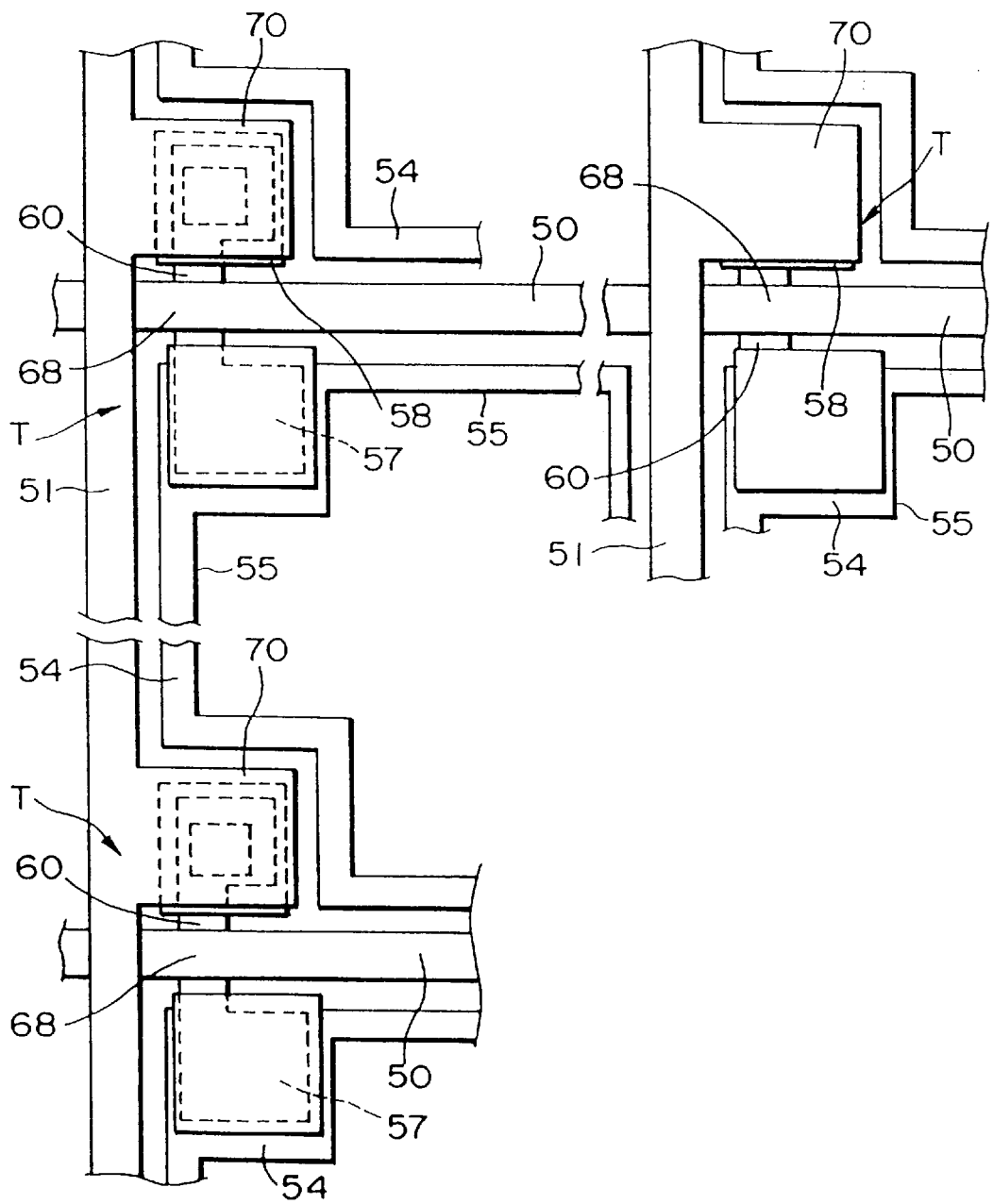
FIG. 2 is a plan view showing interconnections of the first embodiment.

FIGS. 1 and 2 show an essential part of a liquid crystal display device according to the invention. In FIG. 1, there are shown an upper substrate 40 and a lower substrate 41 which are kept away from and are in parallel to each other at a given space (i.e. a cell gap). A liquid crystal layer 42 is provided between the substrates 40, 41, and polarizing plates 43, 44 are, respectively, disposed on the outer sides of the substrates 40, 41 as shown.

These substrates 40, 41 are each made of a transparent material such as glass. In practice, the substrates 40, 41 are surrounded with a sealing member (not shown) around the peripheries thereof, so that a liquid crystal is accommodated in a space established with the substrates 40, 41 and the sealing member to form the liquid crystal layer 42. A liquid crystal cell 45 is constituted of the substrates 40, 41, the liquid crystal layer 42 and the polarizing plates 43, 44 in combination.

In the structure of this embodiment, a plurality of gate interconnections 50 and signal interconnections 51 are formed on the transparent substrate 41 in the form of a matrix as shown in FIG. 2. A pixel electrode 54 is placed in a region surrounded by the gate interconnections 50 and the signal interconnection 51. This region is taken as one pixel region, and a thin-film transistor T is provided in the vicinity of the intersection between the gate interconnection 50 and the signal interconnection 51.

More particularly, as shown in FIG. 1, a light-shielding black mask 55 made of Mo is formed on the substrate 41, and an insulating layer 56 made, for example, of $SiN_x$ is formed on the substrate 41 to cover the black mask 55 therewith. As shown in FIG. 2, the black mask 55 is formed to cover the gate interconnections 50 and the signal interconnections 51 and the thin-film transistor T therewith, and a portion where no black mask 55 is formed is provided within the region surrounded by the gate interconnections 50 and the signal interconnections 51. The pixel electrode 54 made of a transparent conductive film such as of ITO is formed on the insulating layer 56 in such a way as to cover this black mask 55-free portion.

In the vicinity of the intersection between the gate interconnection 50 and the signal interconnection 51 in one pixel region, a drain electrode 57 is formed at a terminal end of the pixel electrode 54, and a source electrode 58 at a portion close to the drain electrode 57 is formed in other pixel region adjacent to the drain electrode 57. A semiconductor unit 60 is formed over these two pixel regions and between the drain electrode 57 and the source electrode 58. The semiconductor unit 60 is constituted of a channel formation portion 61 at the center thereof, and a drain region 62 and a source region 63 which are each made of an n⁺ layer and which are disposed to sandwich the channel formation portion 61 at opposite sides thereof as shown. A silicide layer 64 is formed on the upper surface of the drain region 62 and a silicide layer 65 is formed on the upper surface of the source region 63.

An insulating layer 66 is formed on the substrate to cover the semiconductor unit 60, the drain electrode 57 and the source electrode 58, and a gate electrode 68 is disposed on the channel formation portion 61 of the semiconductor unit 60 via an insulating layer 59. The gate electrode 68 is constituted of part of the gate interconnection 50 as is particularly shown in FIG. 2. A contact hole 69 is formed in the insulating film 66 on the source electrode 58, and the source electrode 58 is connected to the source interconnection 51 via a terminal 70 formed in the contact hole 69.

The drain electrode 57 and the source electrode 58 are, respectively, formed of a metal which is more unlikely to be oxidized than tin and is capable of alloying with silicon. More particularly, the metal consists of a silicide-forming element selected from Cr, Ta, Mo and W. The silicide layers 64, 65 are, respectively, formed such that these silicide-forming elements are diffused into the drain region 62 and the source region 63 each made of amorphous silicon.

Figure 3:
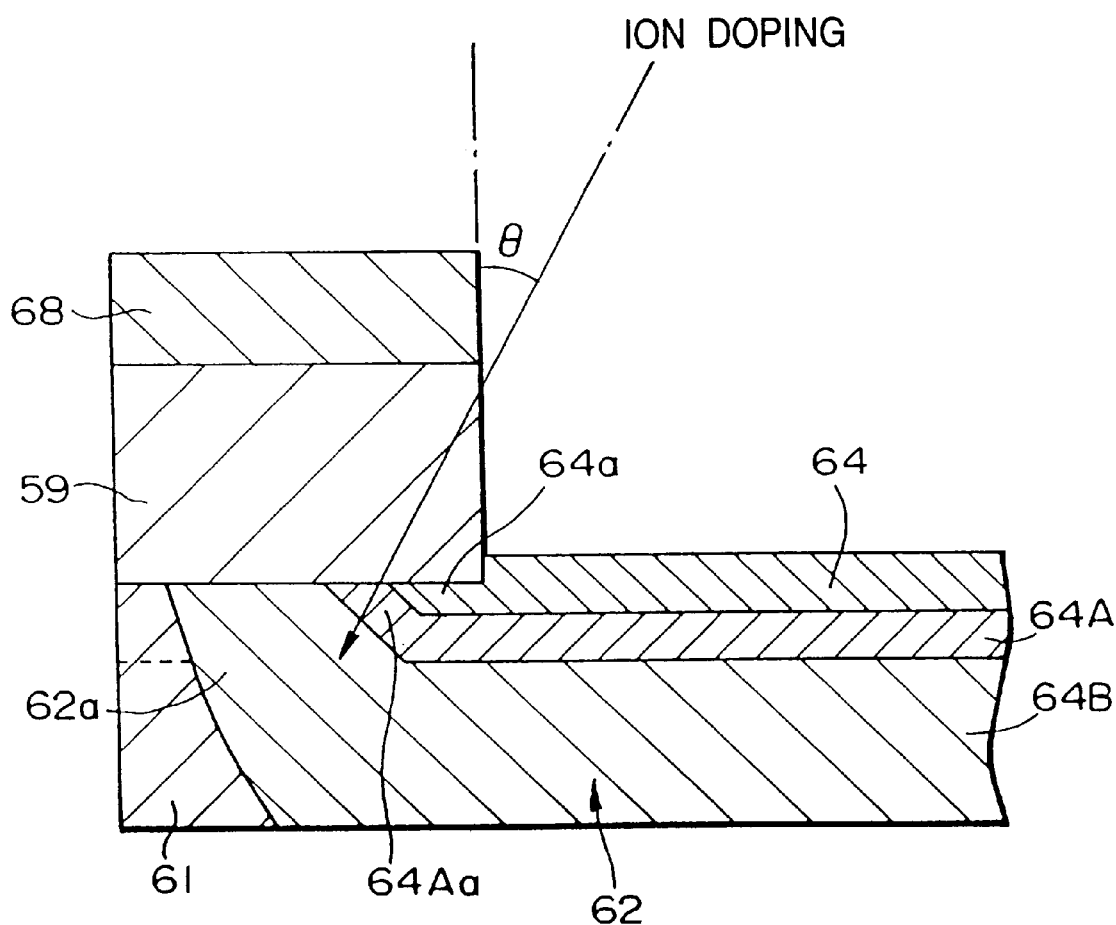
FIG. 3 is an enlarged, sectional view showing a semiconductor portion and a drain region of the first embodiment.

As shown in FIG. 3, the drain region 62 extends to the lower side of the gate insulating layer 59 to form an extension 62a at a lower peripheral margin of the gate insulating layer 59. Moreover, when the extension 62a is viewed as enlarged, a highly dosed layer 64A to which an impurity (i.e. a dopant) is added is formed at the portion between the silicide layer 64 and the drain region 62. A non-highly-dosed layer 64B is formed beneath the highly dosed layer 64A. An extension 64a at the end of the silicide layer 64 is formed as extending to the peripheral margin of the bottom of the gate insulating layer 59. An extension 64Aa at the end of the highly dosed layer 64A is formed as extending to the peripheral lower end of the gate insulating layer 59.

It will be noted that in this embodiment, the highly dosed layer 64A consists of a semiconductor layer wherein $10^{17}$ to $10^{19}$ atoms/cm² of an impurity (i.e. a dopant) are added to and a portion wherein the impurity (i.e. a dopant) is present at a level less than $10^{17}$ atoms/cm² is called the non-highly-dosed layer 64B. In addition, although not shown in the figures, the structure at the side of the source region 63 is similar to one shown in FIG. 3.

In FIG. 1, reference numeral 72 indicates a terminal connected to the black mask 55 via the contact hole formed in the insulating layers 56, 66, and reference numeral 73 indicates a pad connected to a terminal 74 of the gate interconnection buried in the insulating layer 66.

In the structure shown in FIG. 1, the alignment of the liquid crystal is controlled depending on whether a voltage is applied to or not applied to the pixel electrode by operation of the thin-film transistor serving as a switching element.

A beam from backlight provided at the lower side of the substrate 41 is passed by the alignment control of the liquid crystal, whereupon the beam from the backlight can be switched over into a dark or bright state depending on the alignment control of the liquid crystal molecules.

In the structure shown in FIG. 1, the drain electrode 57 made of any of Cr, Ta, Mo or W, which is better in contact with the pixel electrode 54 made of ITO than Al, is connected to the pixel electrode 54 via the silicide layer 64 formed by diffusing the element into the drain region 62. Thus, the low resistance connection between the pixel electrode 54 and the drain region 64 can be realized, with the good contact being ensured.

The resistances which are determined by connecting electrodes made of Al, Cr, Mo and Ta to the ITO pixel electrode 54, respectively, are shown below.

More particularly, when the ITO pixel electrode 54 is provided as a bottom and a metallic electrode formed thereon is provided as a top, the specific resistance in the bottom/top relation is such that ITO/Al=$1\times10^1$ Ω·cm², ITO/Cr=$1\times10^{-4}$ Ω·cm², ITO/Mo=$1\times10^{-7}$ Ω·cm², and ITO/Ta=$1\times10^{-1}$ to $1\times10^{-2}$ Ω·cm². This reveals that the connection resistance becomes much smaller when an electrode made of Cr, Mo or Ta is provided on ITO than when an Al electrode is provided.

Then, the source electrode 58 made of any of Cr, Ta, Mo or W is connected to the source region 63 via the silicide layer 65 whose specific resistance is low. Since the source interconnection 51 made of Al which ensures good contact with any of Cr, Ta, Mo or W is connected to the source electrode 58, the connection between the source electrode 58 and the source interconnection 51 is in good contact. Thus, signals can be transmitted to the thin-film transistor T without causing any delay of the signals from the source interconnection 51, and a drive voltage can be reliably applied to the pixel electrode 54 while the thin-film transistor T is low in loss.

In the structure of the thin-film transistor T shown in FIG. 3 as enlarged, the extension 62a made of the n⁺ layer is formed between the silicide layer 64 and the channel formation portion 61, so that this extension serves as a region of blocking positive holes. Thus, electrons can be readily moved toward the side of the channel formation portion from the silicide layer 64 to the extension 62a. The flow of electrons suffers little influence ascribed to the presence of the positive holes. This inhibits leakage current and the off-current ($I_{OFF}$) of the thin-film transistor can be reduced, thereby suppressing the rise of the off-current, so that the reliability at the time of drive of the liquid crystal is improved.

The method for making the thin-film transistor T having such a structure as shown in FIGS. 1 and 2 is described with reference to FIGS. 4A to 4C, 5A to 5C and 6A to 6C.

Figure 4A:
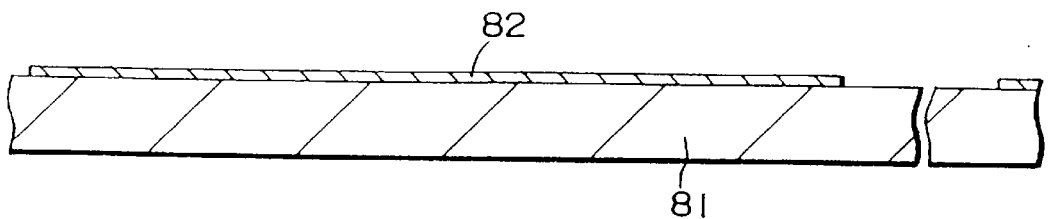

As shown in FIG. 4A, a substrate 81 such as of transparent glass is provided, on which a black mask 82 made of a light-shielding metal such as Mo is formed in a desired pattern formed by use of a first mask in a photolithographic step.

Figure 4B:
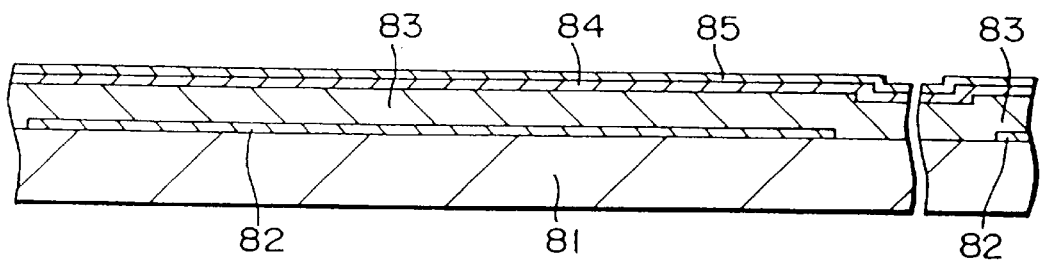

Next, an insulating layer 83 having a thickness of 2000 angstroms and made of SiN$_x$ is formed on the black mask 82 as shown in FIG. 4B, followed by further forming a semiconductor layer 84 having a thickness of about 500 angstroms and made of amorphous silicon and then an about 300 angstroms thick gate insulating layer 85.

Figure 4C:
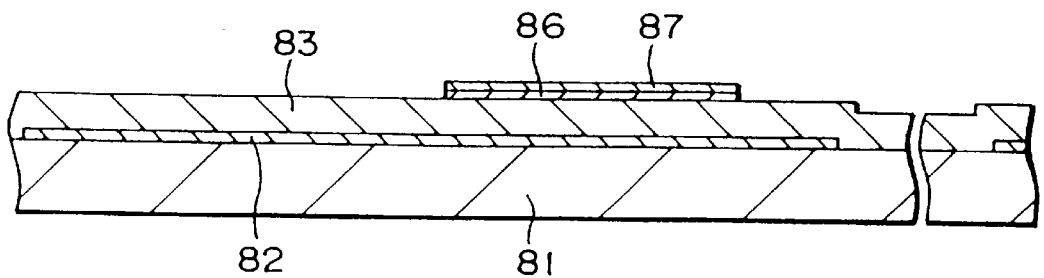

Thereafter, as shown in FIG. 4C, the patterning is carried out using a second mask in a photolithographic step to form a gate insulting layer 87 on the semiconductor layer 86. In FIG. 4C, only one pixel region is indicated, and only one semiconductor layer 86 and only one gate insulating layer 87 formed thereon are depicted. In practice, a number of semiconductor layers 86 corresponding to the number of pixels are formed on the substrate 81.

Figure 5A:
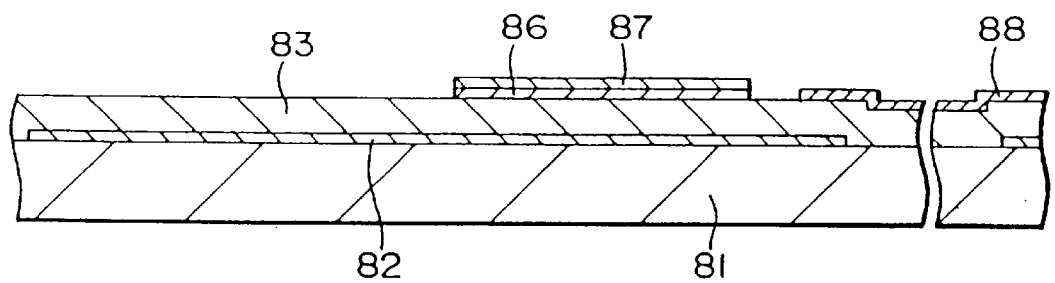
Figure 5B:
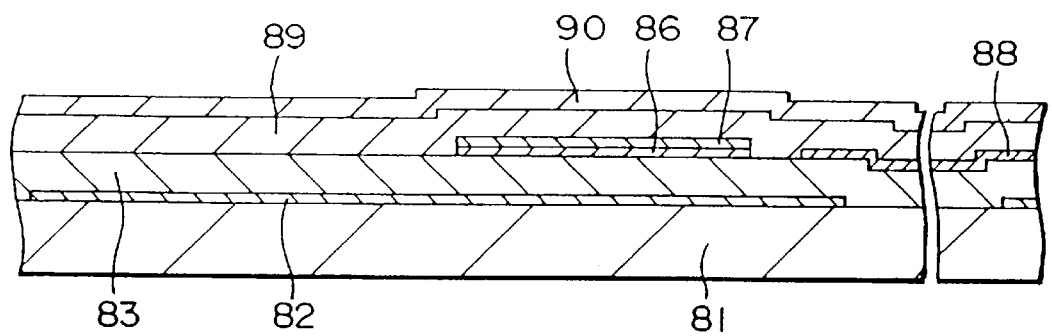

Subsequently, as shown in FIG. 5A, an ITO pixel electrode 88 is formed in individual pixel regions, on which an about 2000 angstroms thick insulating layer 89 is formed as shown in FIG. 5B, followed by further formation of an about 1000 angstroms thick conductive layer 90 made of Al.

Figure 5C:
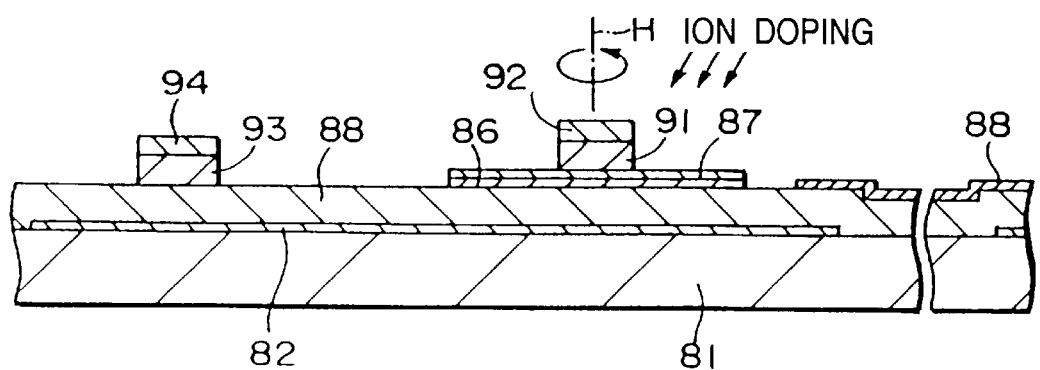

Thereafter, a third mask is used for patterning according to a photolithographic technique to form a gate electrode 92 via the gate insulating layer 91 above the central portion of the semiconductor layer 86. A conductive layer 94 is also formed via an insulating layer 93 so that the layer 94 is kept away from the semiconductor layer 86 as shown in FIG. 5C. It will be noted that the gate electrode 92 consists of part of the gate interconnection and is formed in a required interconnection length in vertical directions as viewed in the FIG. 5C.

In the state shown in FIG. 5C, ion doping is effected from the upper portion of the gate electrode 92 toward an inclined lower portion, thereby causing ion implantation such as of an impurity of $P^+$, $B^+$, $As^+$, $PH^+$, $BH^+$ or the like. At the same time, the substrate 81 is rotated about the normal line H shown in the figure, so that the semiconductor layer 86 around the gate insulting layer 91 is converted to an $n^+$ layer, thereby forming a drain region 95 at one side of the semiconductor layer 86 and a source region 96 at the other side. In addition, a channel formation portion 97 is formed beneath the gate insulting layer 91. Thereafter, the insulating layer 87 is removed from the portions above the source region 96 and the drain region 95 to give a state shown in FIG. 6A.

Figure 6A:
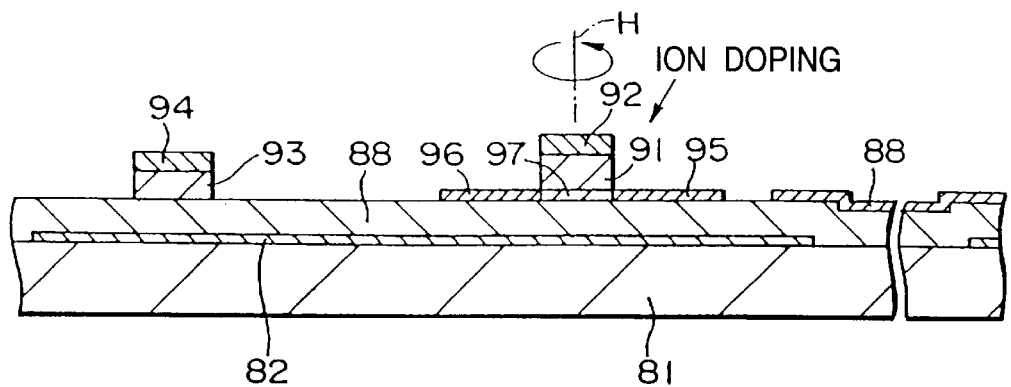
Figure 6B:
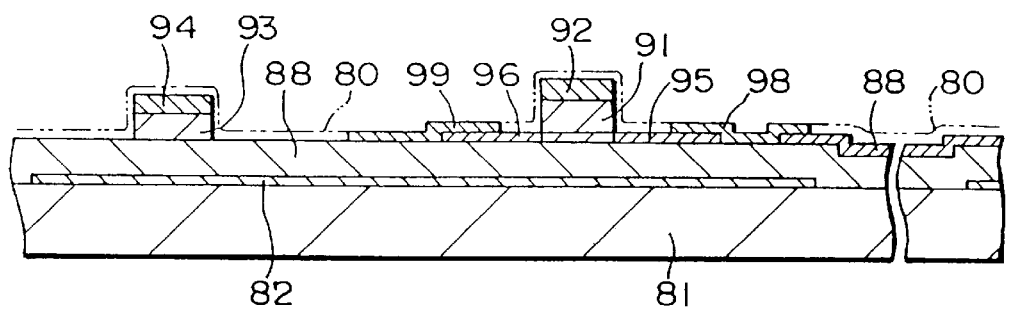

As shown in FIG. 6B, a layer 80 of a silicide-forming element made of any of Cr, Mo, Ta or W is formed to cover the substrate therewith, followed by heating at a temperature within a range of 200 to 400° C., e.g. 200° C., for several hours so that the silicide-forming element of the layer 80 is diffused into the drain region 95 and the source region 96, thereby forming a thin silicide layer in the surface of each of these regions. Thereafter, the silicide-forming element layer 80 is subjected to patterning according to a photolithographic technique using a fifth mask thereby forming a drain electrode 98 and a source electrode 99 as shown in FIG. 6B.

The angle, θ, of irradiation of ions at the time of the ion doping is in the range of 10° to 30° relative to the normal line H of the substrate 81 and is preferably approximately 30°. Where ions are irradiated, it is preferred that an ion gun is fixed toward an oblique direction and the substrate 81 is rotated. Of course, the substrate 81 may be fixed and an ion gun may be so arranged that it can be rotatably moved while being inclined, under which while ions are irradiated on the substrate 81 from an inclined direction, the ion gun is rotated to irradiate ions over the overall periphery of the substrate 81.

The ions are satisfactorily implanted into the portions at opposite sides of the semiconductor layer 86 made of amorphous silicon and not covered with the gate insulating layer 91, with the result that the portions at the opposite sides of the semiconductor layer 86 are converted to $n^+$ layers, thereby forming the drain region 95 and the source region 96.

In contrast, the central portion of the semiconductor layer covered with the gate insulating layer 59 is not implanted with the ions. However, the substrate 81 is rotated while inclining the angle of irradiation of the ions, the ions are transmitted through the gate insulating layer 91 with respect to its thin portion about the peripheral margin of the bottom thereof, so that an $n^+$ layer is formed beneath the peripheral margin of the gate insulating layer 91, thereby forming an extension made of the $n^+$ layer.

Figure 6C:
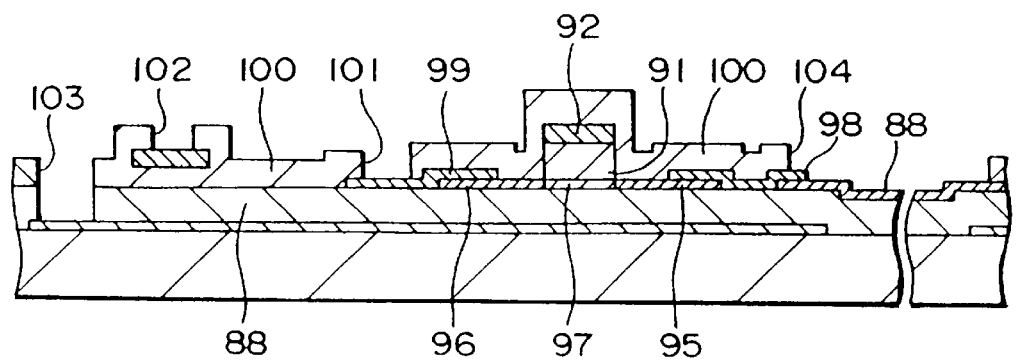

Thereafter, as shown in FIG. 6C, an insulating layer 100 is formed, and a contact hole 101 is formed in the insulating layer 100 at a portion thereof above the source electrode 99. Moreover, a contact hole 102 is formed in the insulating layer 100 at a portion above the conductive layer 94. A contact hole 103 is also formed in the insulating layers 88, 100 above the pixel electrode 88. The insulating layer on the pixel electrode 88 is removed to expose the pixel electrode. Then terminals necessary for these contact holes are formed, thereby obtain a thin-film transistor having such a structure as shown in FIG. 1.

When the thin-film transistor is made in a manner as set out hereinabove, the silicide layers of the drain region 95 and the source region 96 can be formed simultaneously with the formation and thermal treatment of the silicide-forming element layer 80. While leaving part of the silicide-forming element layer 80, the drain electrode 98 and the source electrode 99 can be reliably formed.

Figure 7:
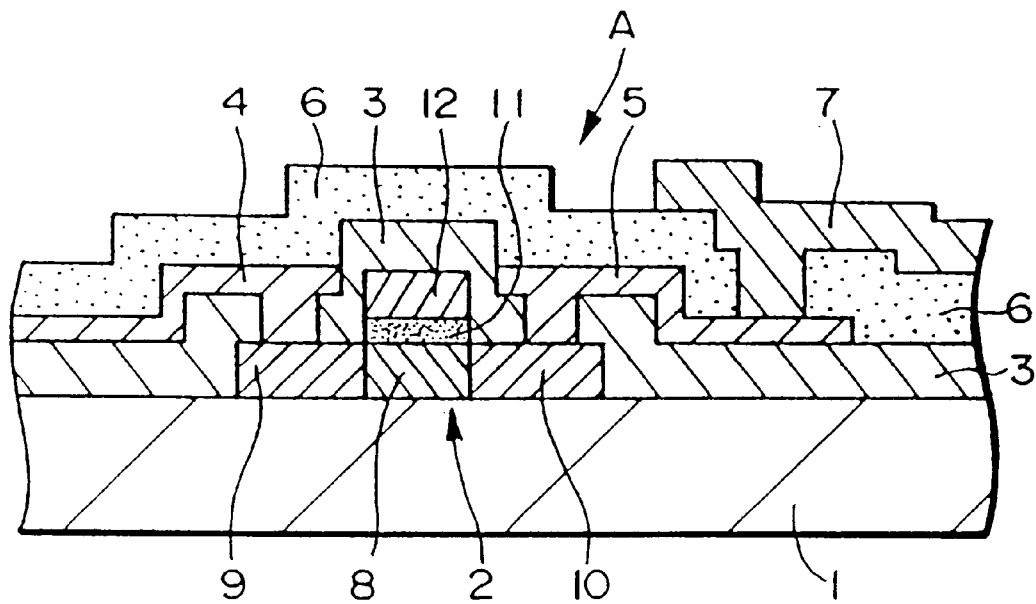
FIG. 7 is a sectional view showing a known structure of a thin-film transistor of the top gate type.
Figure 8:
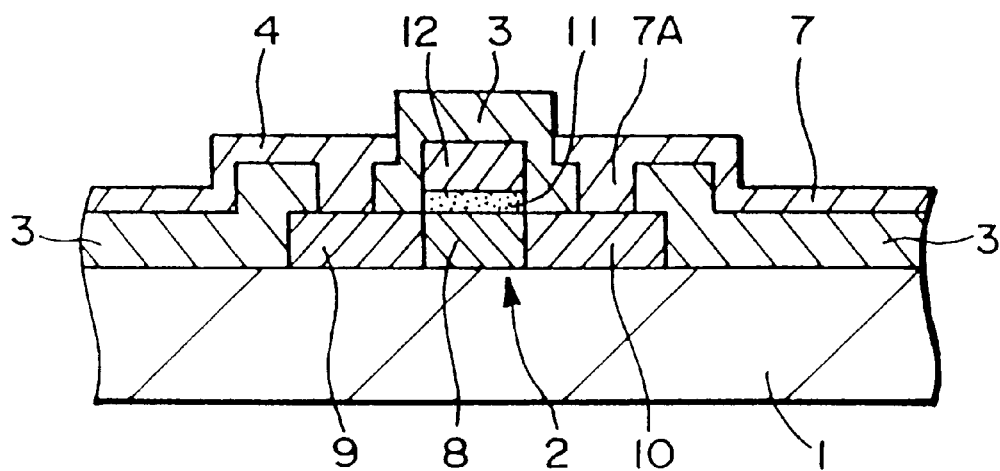
FIG. 8 is a sectional view showing another known structure of thin-film transistor of the top gate type.

Moreover, unlike the known structure shown in FIG. 7, the manufacturing method of the invention is advantageous in that the pixel electrode can be formed on the substrate, any contact hole is not formed in an insulating layer for connection between the pixel electrode and the drain electrode, and it is not necessary to form any insulating layer at a boundary between the pixel electrode and the drain electrode, thereby not increasing the number of masks necessary in the photolithographic steps. While reducing the number of necessary masks, as set out hereinbefore, the pixel electrode and the drain electrode, the drain electrode and the drain region, the source electrode and the source region, and the source electrode and the source interconnection can be, respectively, connected in good contact.

As will be apparent from the foregoing, according to the invention, a drain region and an ITO pixel electrode, which are, respectively, formed on a substrate are connected with a drain electrode which is more unlikely to be oxidized than tin and is capable of alloying with silicon. The element constituting the drain electrode is diffused into a drain region to form a silicide layer, through which the drain electrode is connected to the drain region. Thus, there can be obtained a structure where the transparent pixel electrode made of ITO is connected to the drain electrode via the silicide layer, thus ensuring low resistance connection.

Using a source electrode made of a metal which is more unlikely to be oxidized than tin and is capable of alloying with silicon, an element constituting the source electrode is diffused into a source region to form a silicide layer, through which the source electrode is connected to the source region. As a result, there can be provided a structure where the source electrode and the source region of the semiconductor unit is connected at a low resistance.

Moreover, in the practice of the invention, when the source electrode made of a metal selected from Cr, Mo, Ta or W is connected to a source interconnection made of Al, low resistance connection between the element selected from Cr, Mo, Ta or W and constituting the source electrode and Al can be realized. Thus, good contact of low resistance between the source electrode and the source interconnection is attained, so that the delay of signals in the source interconnection is unlikely to occur.

In the practice of the invention, there can be obtained a liquid crystal display device comprising a thin-film transistor which includes a structure of low resistance connection between the drain electrode and the transparent pixel electrode made of ITO, and a structure where a source electrode is connected to a source region via a silicide layer, thus the low resistance connection between the source electrode and the source region of the semiconductor unit being ensured.

The method of the invention comprises forming a semiconductor unit and a pixel electrode made of ITO on a substrate, forming an electrode layer made of Cr, Mo, Ta or W on the thus formed substrate, subjecting the electrode layer to thermal treatment to cause a constituent element of the electrode layer to be diffused into a source region and a drain region to form silicide layers, respectively, forming a drain electrode and a source electrode, and forming a source interconnection connecting to the source electrode, so that there can be obtained a low resistance connection structure of the drain region and the drain electrode through the silicide layer and a low resistance connection structure of the source region and the source electrode through the silicide layer.

The drain electrode made of Cr, Mo, Ta or W can be connected to the pixel electrode made of ITO in good contact of a low resistance.

What is claimed is:

1. A thin-film transistor comprising:

a channel formation portion including a silicon semiconductor film formed on a substrate and sandwiched between a source region and a drain region, said source region and said drain region including a layer formed by ion doping of both sides of the channel formation portion;

a gate insulating layer disposed above said channel formation portion;

a gate electrode formed on said gate insulating layer such that both ends of said gate electrode are arranged at both sides of said channel formation portion;

a source electrode electrically connected with said source region;

a drain electrode electrically connected with said drain region, said source electrode and said drain electrode being formed of a metal alloyable with silicon and having a smaller oxidation potential than tin;

a silicide layer formed from said metal and silicon fabricated on a surface of said drain region and a surface of said source region, the silicide layer directly contacting said gate insulating layer from both sides, the source electrode and drain electrode formed on the respective silicide layer and an insulating layer; and a protective insulating layer formed over said source electrode, said gate electrode, said drain electrode, said both sides of said gate insulating layer, a surface of said silicide layer exposed between said source electrode and said gate insulating layer, and a surface of said silicide layer exposed between said drain electrode and said gate insulating layer;

wherein said suicide layer is formed by diffusion of constituents in said source electrode and said drain electrode into said surface of said source region and said surface of said drain region by a heat treatment to said source electrode and said drain electrode, and said end of each of said source region and said drain region are arranged at a predetermined distance from both sides of said gate insulating layer.

2. A thin-film transistor as defined in claim 1, wherein said metal is a member selected from the group consisting of Mo, Cr, Ta, or W.

3. A thin-film transistor according to claim 1, wherein said silicon semiconductor comprises amorphous silicon.

4. A thin-film transistor according to claim 1, wherein a portion of said silicide layer formed on said source region extends beneath one end of said gate insulating layer and another portion of said silicide layer formed on said source region extends beneath another end of said gate insulating layer.

5. A TFT liquid crystal display device comprising the thin-film transistor of claim 1.

* * * * *